(12) United States Patent
Kao et al.

(10) Patent No.: US 7,021,943 B2
(45) Date of Patent: Apr. 4, 2006

(54) OPTICAL TRANSMISSION MODULE

(75) Inventors: Min Sheng Kao, Hsinchu (TW); Cheng Hung Tsai, Hsinchu (TW); Chia Hung Chiu, Hsinchu (TW); Shun Tien Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/816,327

(22) Filed: Apr. 1, 2004

(65) Prior Publication Data
US 2005/0090146 A1   Apr. 28, 2005

(30) Foreign Application Priority Data
Oct. 24, 2003   (TW) ............... 92129665 A (51) Int. Cl.
*H01R 12/00*   (2006.01)
*H05K 1/00*   (2006.01)

(52) U.S. Cl. ........................... 439/67

(58) Field of Classification Search ............ 439/79, 439/67, 80, 629
See application file for complete search history.

(56) References Cited

U.S. PATENT DOCUMENTS

| 5,513,073 A | 4/1996 | Block et al. ............ 361/719 |
| 5,742,480 A | 4/1998 | Sawada et al. .......... 361/749 |

*Primary Examiner*—Javaid H. Nasri
(74) *Attorney, Agent, or Firm*—Welsh & Katz, Ltd.

(57) ABSTRACT

An optical transmission module comprising at least a photoelectric element, a printed circuit board and a flexible printed circuit board is provided. The flexible printed circuit board electrically connects the photoelectrical elements and the printed circuit board. At least a ground plane is formed on the flexible printed circuit board to reduce crosstalk and electromagnetic interference. Transmission lines and impedance formed on the flexible printed circuit board solve the problems of signal distortion and impedance mismatch. The flexible printed circuit board also serves as a flexible interface to solve prior problems of connection stress between the photoelectric element and the printed circuit board.

10 Claims, 15 Drawing Sheets

OPTICAL TRANSMISSION MODULE

This Non-provisional application claims priority under 35 U.S.C. § 119(a) on patent Application No. 092129665 filed in Taiwan on Oct. 24, 2003, the entire contents of which are hereby incorporated by reference.

BACKGROUND OF THE INVENTION

1. Field of the Invention

The invention generally relates to an optical transmission module, and in particular relates to an optical transmission module using a flexible printed circuit board as a connecting interface between the photoelectric element and the circuit board.

2. Related Art

In the field of optical data processing, optical transmitter/receiver transmits the data signal of processed information through an emitter into optical signal. The optical signal transferred through optical fiber to a remote photoelectric receiver where the optical signal is further converted into electrical signal so as to accomplish data communication.

Some prior art optical data transmission modules are disclosed in patents such as U.S. Pat. No. 5,742,480 and U.S. Pat. No. 5,513,073.

In U.S. Pat. No. 5,742,480, a flexible printed circuit board is used to carry the circuit of whole module. The integrated circuit element is soldered directly on the flexible printed circuit board. The complicated control circuit and photoelectric element are all mounted on the board. The photoelectric element is fixed on the board through holes. In order to align the optical axis, an almost right angle bend for the flexible printed circuit board is required.

In U.S. Pat. No. 5,513,073, an optical transmission module mainly includes a flexible printed circuit board, heat spreader and thermal isolator. The flexible integrated circuit is similar to U.S. Pat. No. 5,742,480 that a complicated control circuit and photoelectric element is used; holes and almost a right angle bend are required for optical axis alignment.

The U.S. Pat. No. 5,742,480 and U.S. Pat. No. 5,513,073 have some possible problems. For example, the multiple-layer flexible board used in U.S. Pat. No. 5,742,480 increases the manufacturing difficulty. The circuits on the flexible board of the two patents are very complicated that make the fabrication and assembly difficult. The connections between the optical members and the flexible printed circuit board require holes that easily cause signal distortion, parasitic effects and fail to achieve high data rate transmission. Further, the bending of the flexible printed circuit board easily causes unreliable signal. The signals at the transmitter and the receiver are easy to be influenced. No countermeasures are provided in the prior arts.

Figure 1:
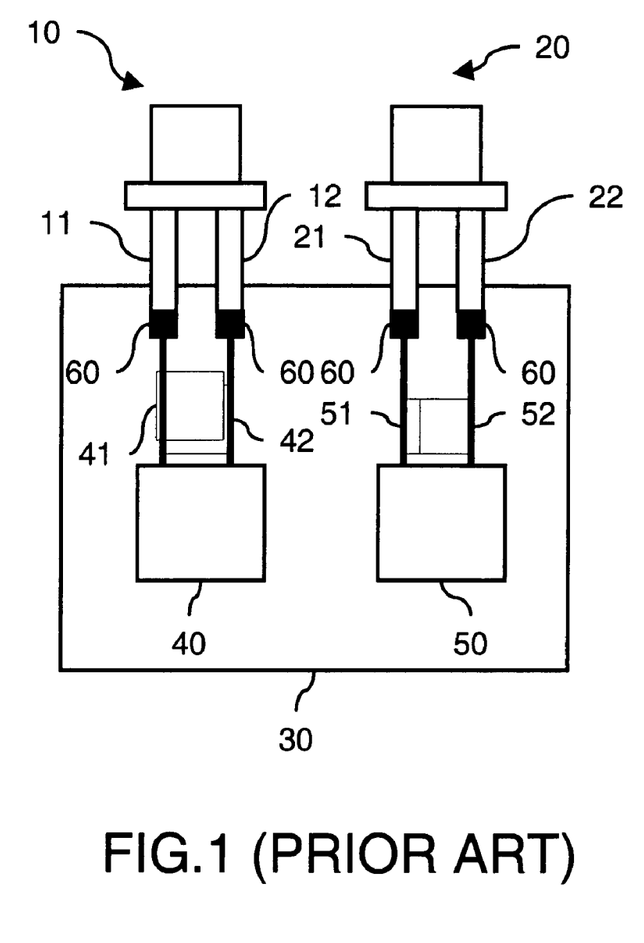
FIG. 1 is a constructional view of a prior art optical transmission module.

Another prior art of optical transmission module is illustrated in FIG. 1. The photoelectric element 10 has a signal pin 11 and a non-signal pin 12 connecting to the integrated circuit 40 on the main circuit board 30 via connecting points 60 and transmission lines 41, 42. The photoelectric element 20 has a signal pin 21 and a non-signal pin 22 connecting to the integrated circuit 50 on the main circuit board 30 via connecting points 60 and transmission lines 51, 52. The connectors in this construction have problems of stress during connecting and decrease signal fidelity and cause interference to the receiver.

As described above, the optical transmission modules of prior arts have problems of lower signal fidelity and interference between transmitter and receiver.

SUMMARY OF THE INVENTION

The object of the invention is to provide an optical transmission module that can prevent from signal fidelity reduction caused by photoelectric transformation through the transmission interface, and can improve the quality of data transmission. A flexible printed circuit board connects the photoelectric element and the main circuit board. The flexible printed circuit board includes grounding to prevent crosstalk and to prevent from problems of electromagnetic emission and interference.

The flexible printed circuit board and the coupling circuit effectively solve the problems of high data rate signal loss and mismatch between the photoelectric element and the circuit board. The flexible printed circuit board also solves the problem of connection stress between the circuit board and the photoelectric element and allows the bending based on mechanical design.

Four embodiments of the invention are provided in the following description. A first embodiment of optical transmission module according to the invention includes at least a photoelectric element for optical and electrical signal transformation, and a flexible printed circuit board connecting the photoelectrical element and a circuit board. The pins of the photoelectrical element are soldered or fixed through other means to the flexible printed circuit board. There are transmission lines connecting to the circuit board.

In a second embodiment of the invention, a passive element is included on the flexible printed circuit board for impedance matching.

In the first and second embodiments, all the pins are connected to the circuit board through transmission lines. In a third and a fourth embodiments, only a pin is connected to the printed circuit board.

An optical transmission module according to the invention can reduce the signal fidelity reduction caused by photoelectric transformation through the transmission interface so as to improve the quality of data transmission. Through improvements of photoelectric elements, such as photoelectric elements packed by the currently most popular TOCAN (Transistor Outline CAN) method, and the interface between printed circuit boards, a high data rate optical transmission can be achieved without the need of expensive, bulky or new package methods.

Under considerations of fabricability and less cost increase, an optical transmission module of the invention can be well integrated with mechanical design to further improve the reliability. The module can solve the problems of electromagnetic emission and interference, signal crosstalk and so on, and enhance the performance of the whole module.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 2:
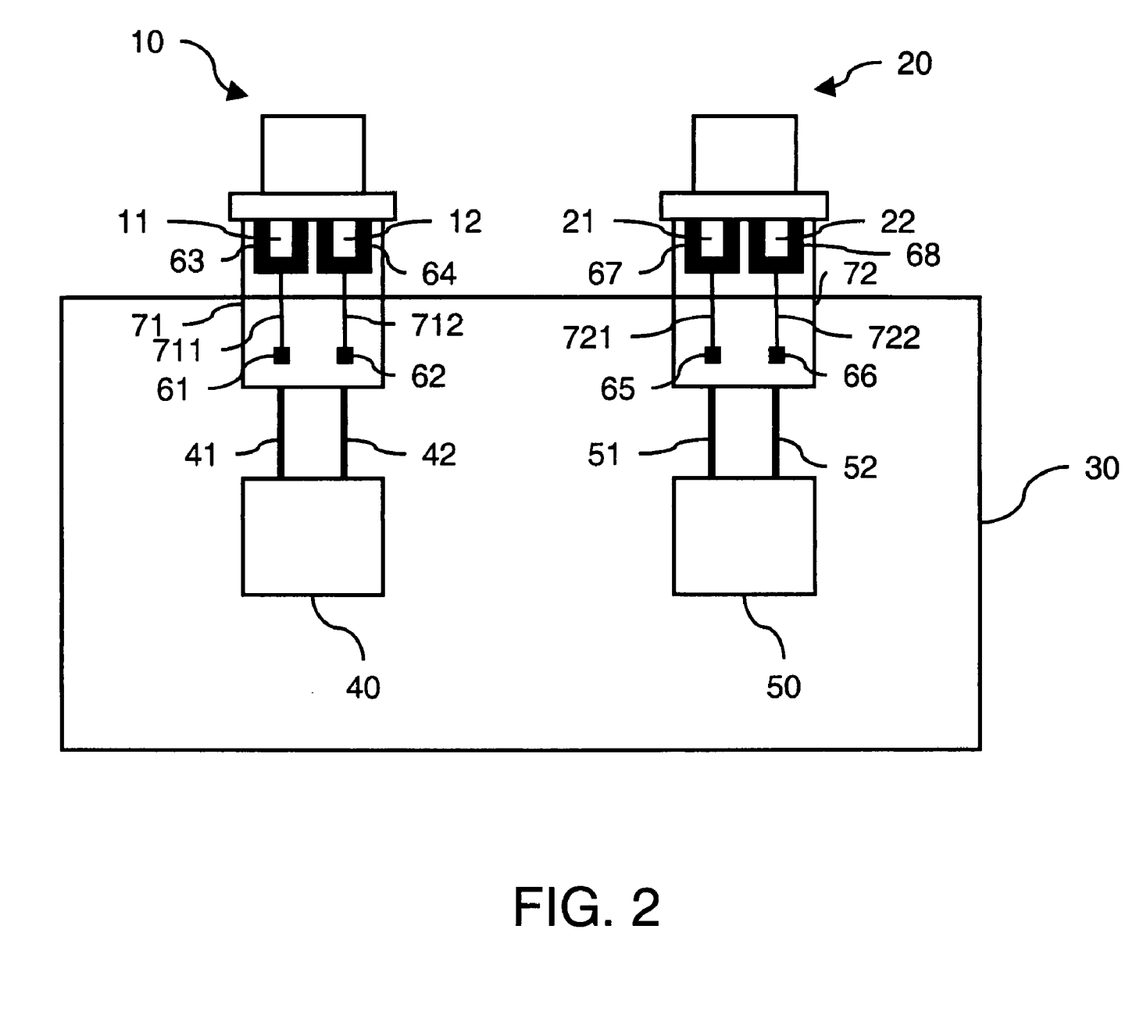
FIG. 2 is a constructional view of a first embodiment optical transmission module of the invention.

FIG. 2 shows a first embodiment of the invention. Two photoelectric elements 10 and 20 are used. One works as a transmitter and the other as a receiver; or all as transmitter or receiver. Of course, there can only be one photoelectric element.

In the prior art, the pins of photoelectric elements are directly connected to printed circuit board. In the invention, the pins are electrically connected through an interface of flexible printed circuit board.

Pins of photoelectric element can be generally classified as signal pins and non-signal pins. The signal pins are for transmitting or receiving data. The non-signal pins are for power input or grounding.

For the photoelectric element 10, signal pins 11 and 12 are electrically connected to the flexible printed circuit board 71 via connecting points 63 and 64 respectively. A transmission line 711 connects the connecting point 63 and a connecting point 61. A transmission line 712 connects the connecting point 64 and a connecting point 62. The connecting points 61 and 62 connect the flexible printed circuit board 71 to the printed circuit board 30. There are transmission lines 41 and 42 connecting the signal to the integrated circuit 40. The signal pins 11 and 12 are located on a signal transmission plane of the flexible printed circuit board 71.

For the photoelectric element 20, signal pins 21 and 22 are electrically connected to the flexible printed circuit board 72 via connecting points 67 and 68 respectively. A transmission line 721 connects the connecting point 67 and a connecting point 65. A transmission line 722 connects the connecting point 68 and a connecting point 66. The connecting points 65 and 66 connect the flexible printed circuit board 72 to the printed circuit board 30. There are transmission lines 51 and 52 connecting the signal to the integrated circuit 50. The signal pins 21 and 22 are located on a signal transmission plane of the flexible printed circuit board 72.

The number and positions of pins in FIG. 2 are only for description and not for limitation of the applications. The number of printed circuit board 30 can be accommodated to the number of photoelectric element. For example, a printed circuit board for receiver and a printed circuit board for transmitter. The layers of the flexible printed circuit boards 71 and 72 can be designed based on pins of the photoelectric elements.

Figure 3A:
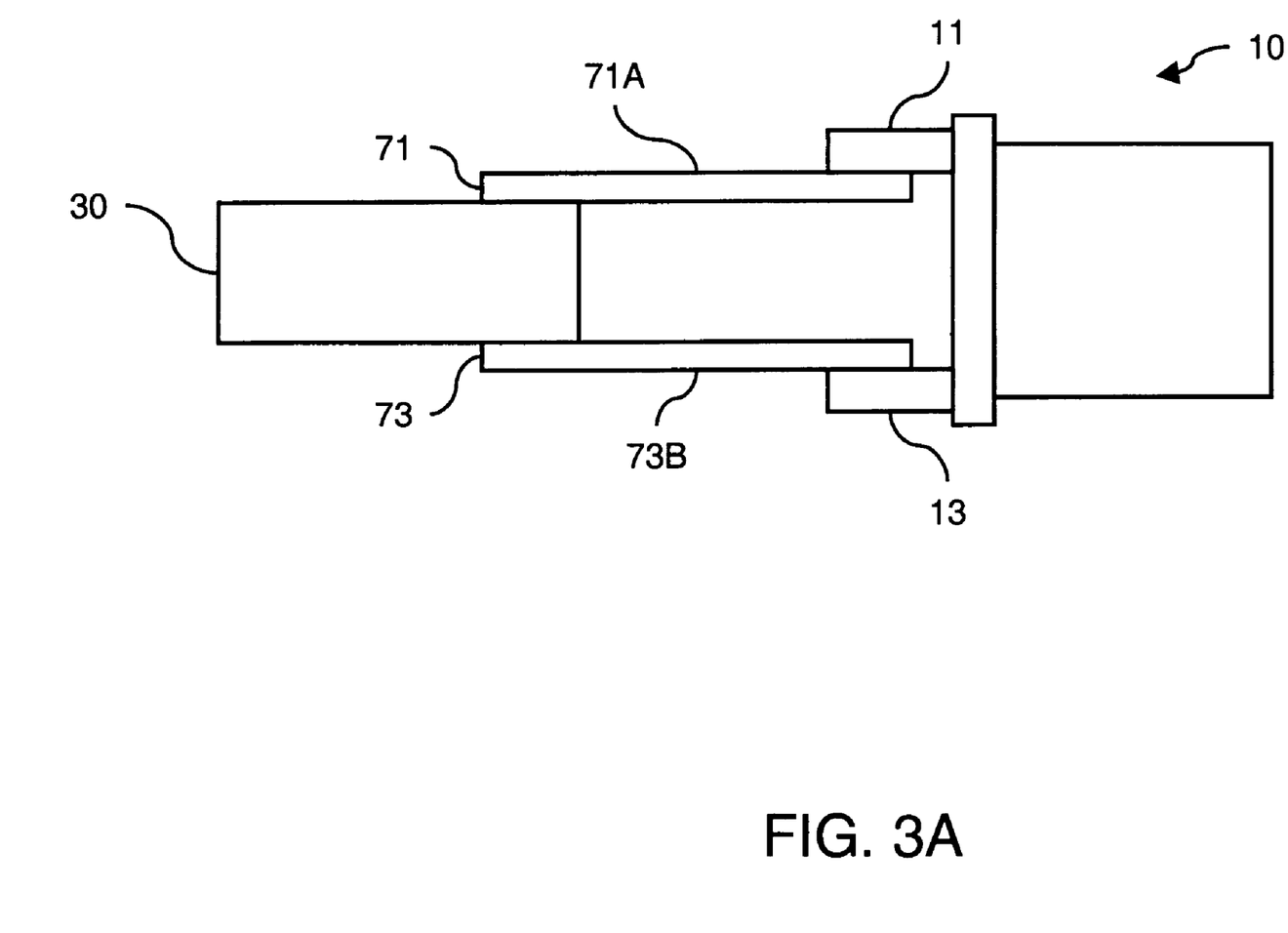
FIGS. 3A to 3D are alternative sectional side views of a first embodiment of the invention.

FIGS. 3A to 3D are alternative sectional side views of an optical transmission module of the invention. In FIG. 3A, the flexible printed circuit board 71 includes a signal transmission plane 71A. The flexible printed circuit board 73 includes a ground plane 73B. The signal pin 11 of the photoelectric element connects to the signal transmission plane 71A. The non-signal pin 13 connects to the ground plane 73B. The flexible printed circuit boards 71 and 73 locate on different planes of the printed circuit board 30.

Figure 3B:
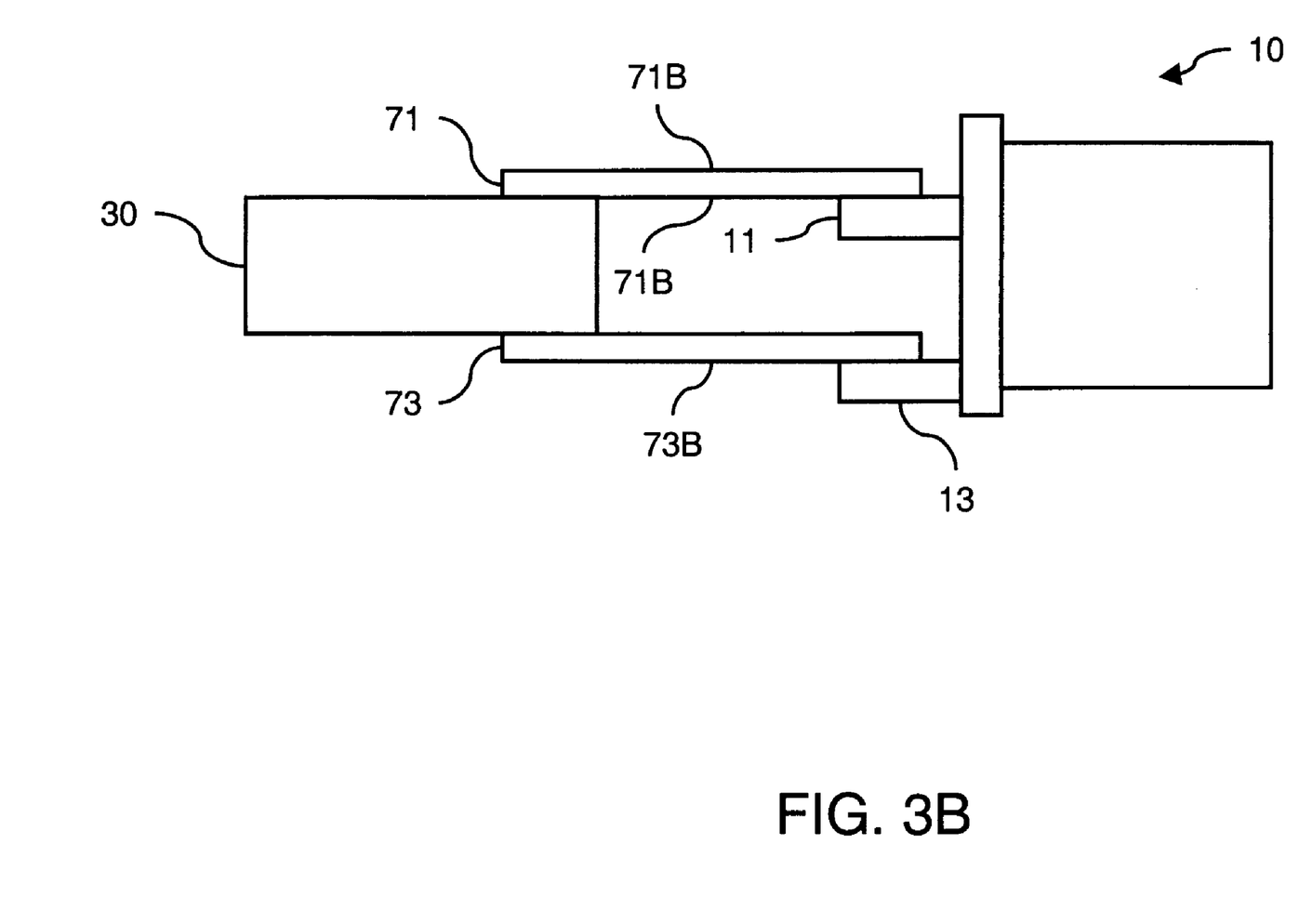

In the FIG. 3A arrangement, the ground plane 73B of the flexible printed circuit board 73 isolates external electromagnetic interference. However, the signal pin 11 is sensible to external electromagnetic interference. Therefore, as shown in FIG. 3B, the signal transmission plane 71A locates at the bottom of the flexible printed circuit board 71 so that the signal pin 11 is isolated from interference. The isolation can further be improved by applying a ground plane 71B on top of the flexible printed circuit board 71.

Figure 3C:
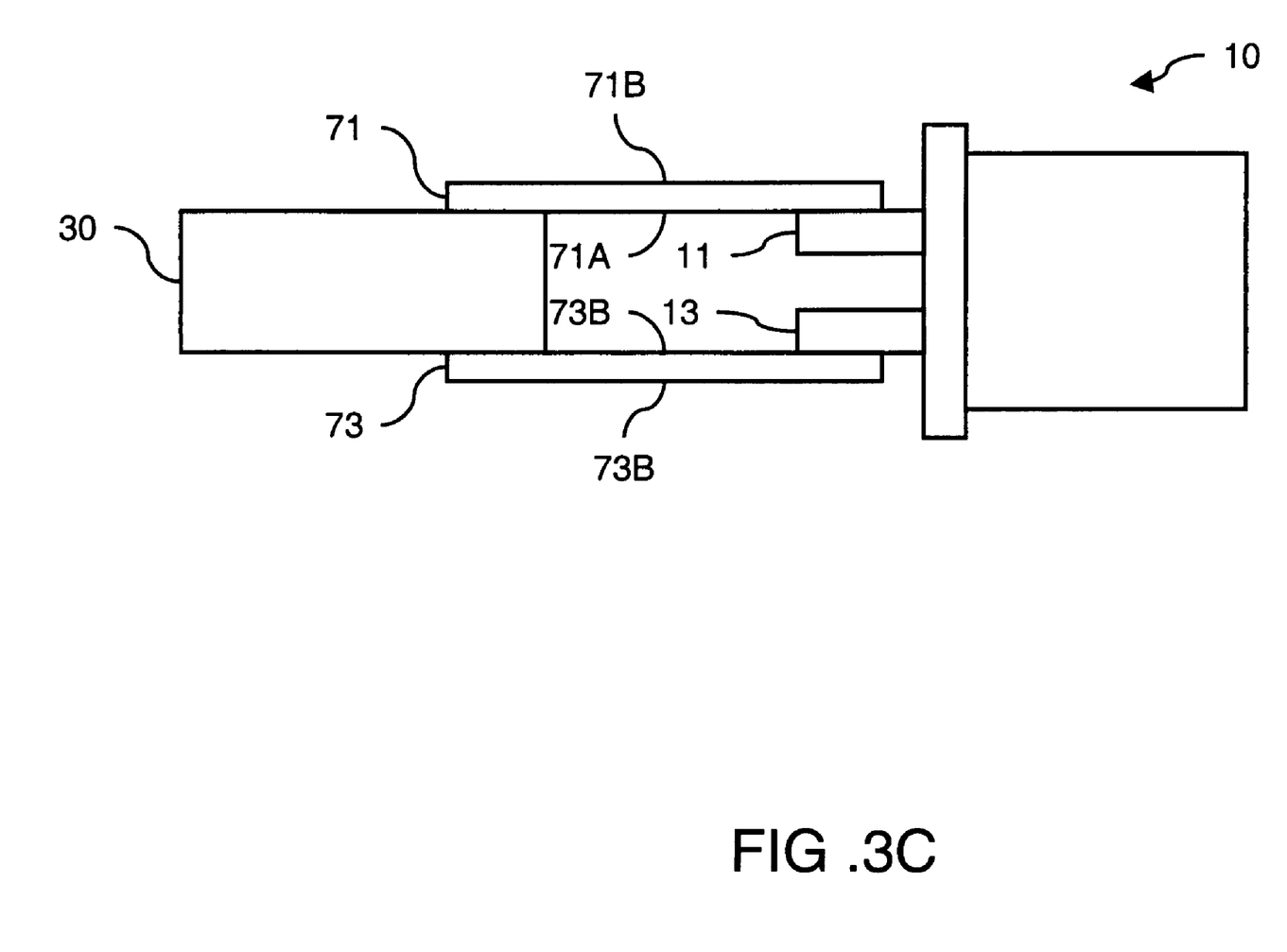

The position of the non-signal pin 13 can be located on a ground plane 73B on upper plane of the flexible printed circuit board 73 as shown in FIG. 3C. Therefore, the pins are isolated from electromagnetic interference by the ground planes 71B, 73B.

Figure 3D:
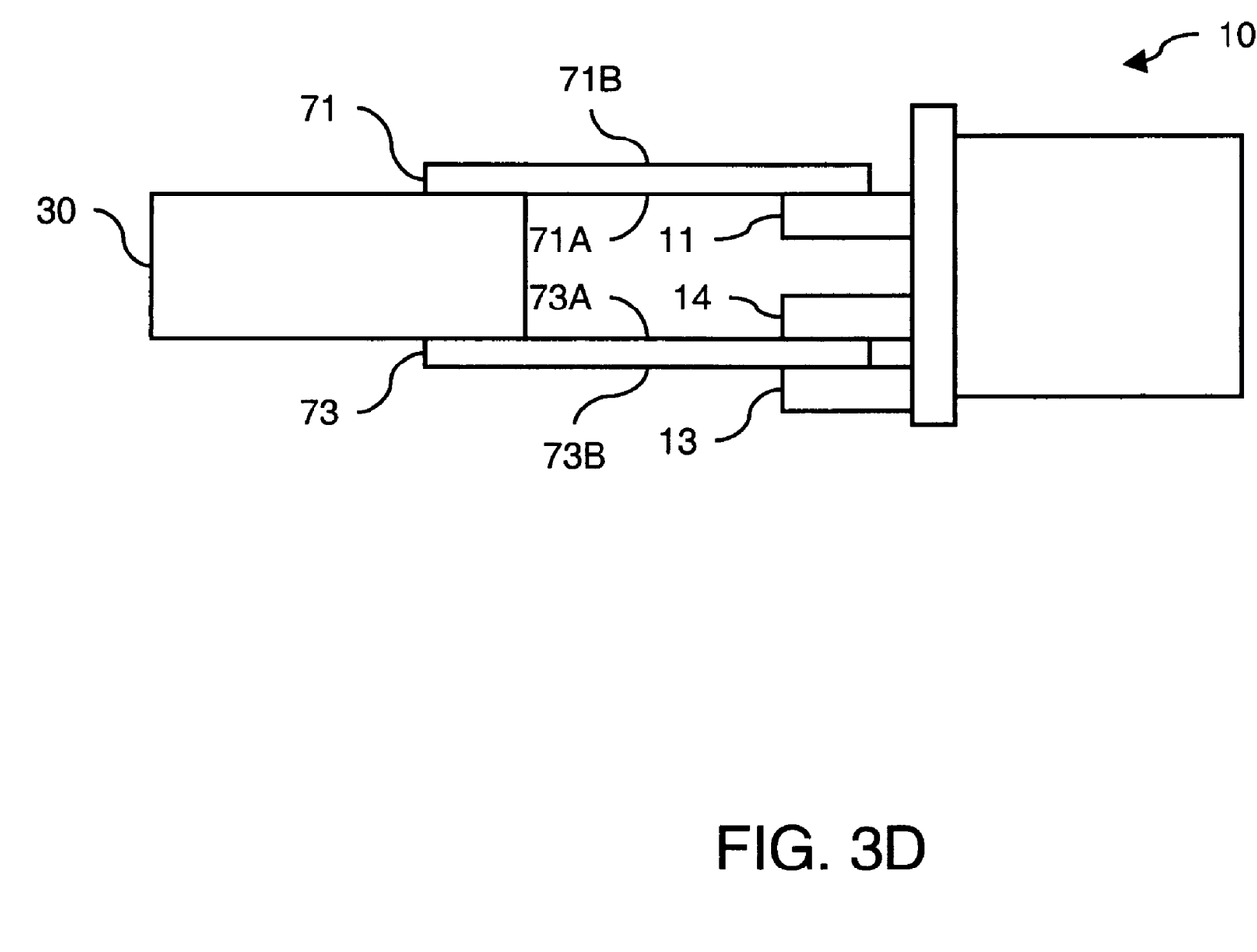

FIG. 3D illustrates an arrangement of multiple pins. The flexible printed circuit board 71 includes a signal transmission plane 71A and a ground plane 71B. The flexible printed circuit board 73 includes a signal transmission plane 73A and a ground plane 73B. The signal pin 11 is connected to the signal transmission plane 71A. The signal pin 14 is connected to the signal transmission plane 73A. The non-signal pin 13 is connected to the ground plane 73B. Therefore, the pins are isolated from external electromagnetic interference by the ground planes 71B, 73B.

On the flexible printed circuit board, there are transmission lines with impedance elements for making impedance matching between the printed circuit board 30 and the photoelectric elements 10 and 20. The flexible printed circuit board and the photoelectric elements are connected by flat contact such that the flexible printed circuit board can be extended from said pins and parallel to the optical axis of the photoelectric elements. No sharp bend occurs during assembly so as to increase the reliability of the module. The construction is simple, easy to be fabricated and lower of cost.

The embodiment of the invention uses flexible printed circuit board and ground planes to isolate or reduce interferences between the transmitter and the receiver. The signal transmission can be located on different planes of the flexible printed circuit board so that the transmitter and the receiver are isolated by the space so as to reduce radio data rate interference and obtain better quality of signal.

The good transmission lines on the flexible printed circuit board gives continuous impedances for the pins of the photoelectric element so that the signals are fully transmitted; a high quality data transmission is obtained, and radio data rate interference is reduced.

Figure 4:
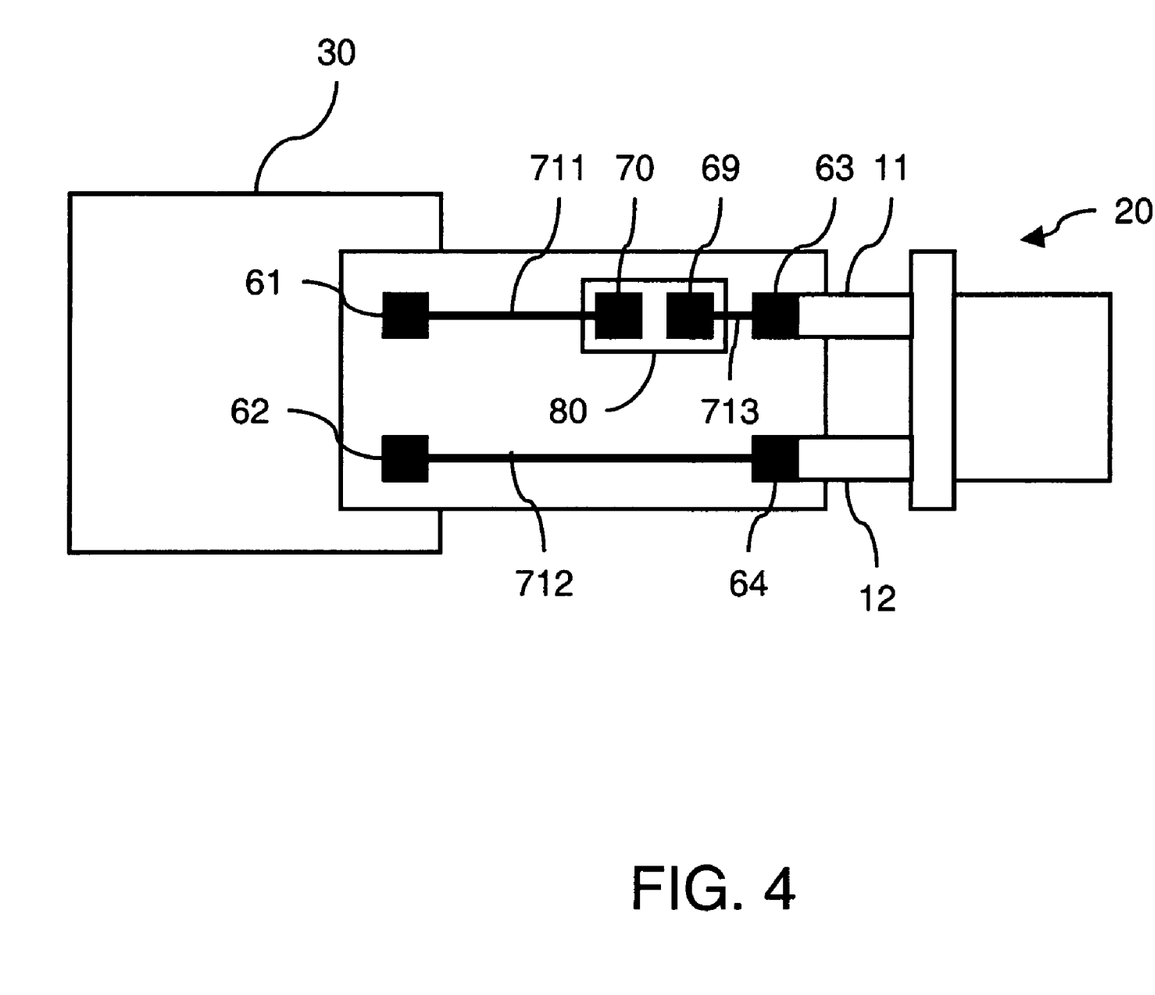
FIG. 4 is a constructional view of a second embodiment of the invention.
Figure 5:
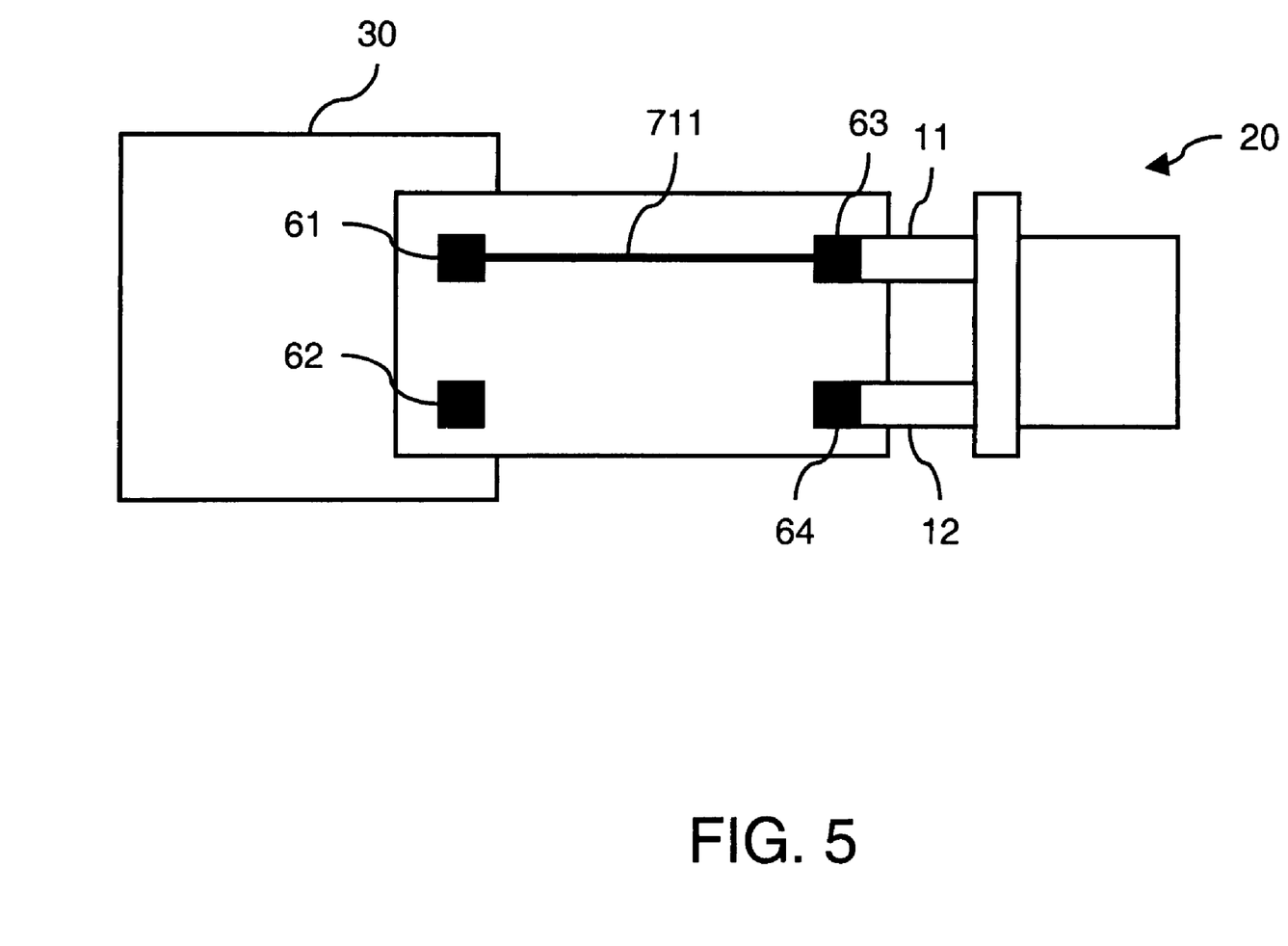
FIG. 5 is a constructional view of a third embodiment of the invention.
Figure 6:
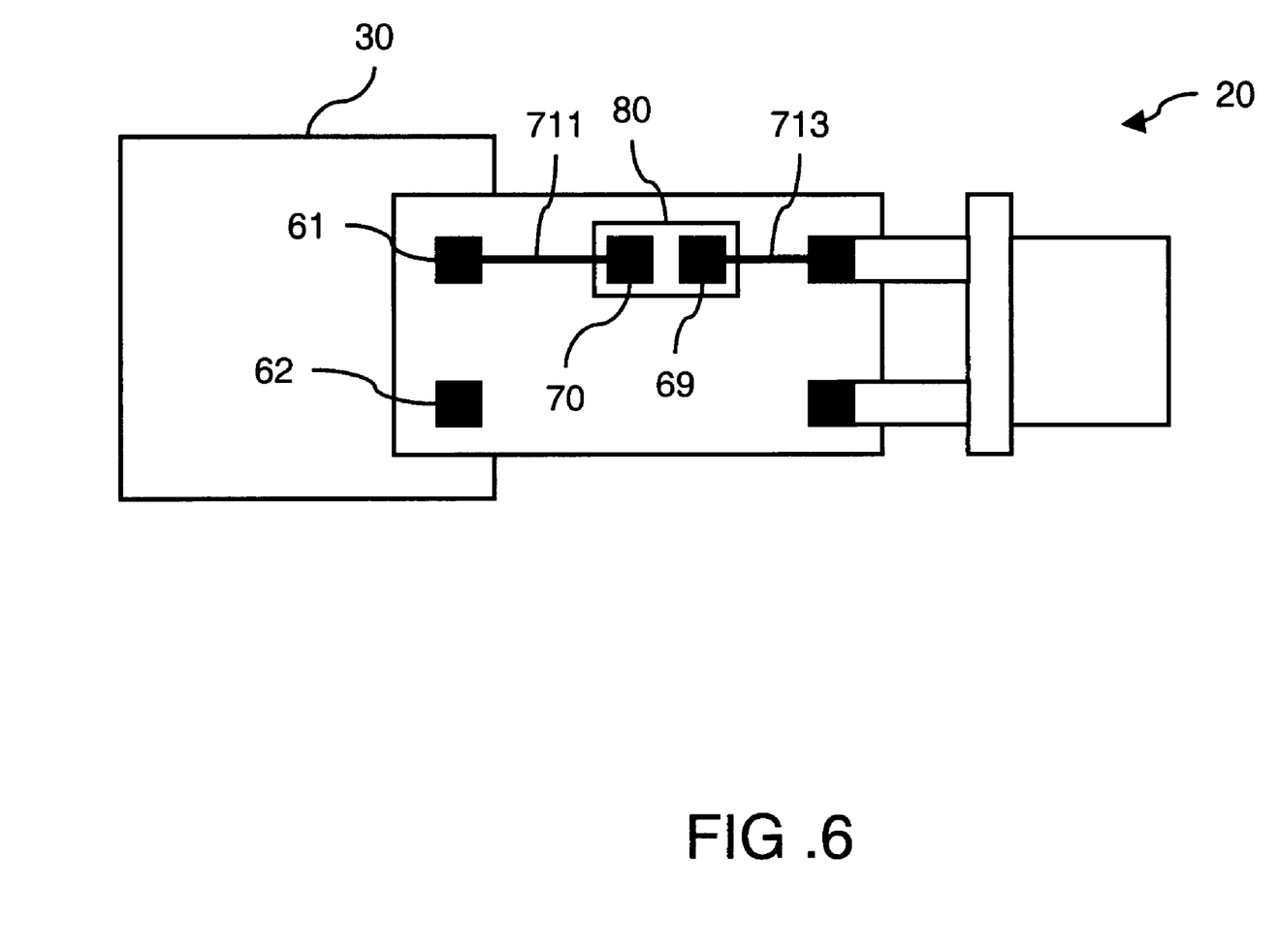
FIG. 6 is a constructional view of a fourth embodiment of the invention.

Referring to FIG. 4, another embodiment of the invention has a passive element 80 soldered on the data transmission plane for impedance matching of the photoelectric element 20. The passive element 80 connects via a connecting point 69, a transmission line 713 to a connecting point 63 of a pin 11; and connects via a connecting point 70, a transmission line 711 to a connecting point 61 on the printed circuit board 30. A connector 64 for another pin 12 connects via transmission line 712 to a connector 62 on the printed circuit board 30. Opposing to the signal transmission plane, there is a ground plane at the opposite side.

The crosstalk between the receiver and the transmitter in the optical transmission module of the invention is prevented, and a higher quality of signal and better performance of high data rate transmission are obtained. The performance can be checked through eye diagrams.

Figure 7:
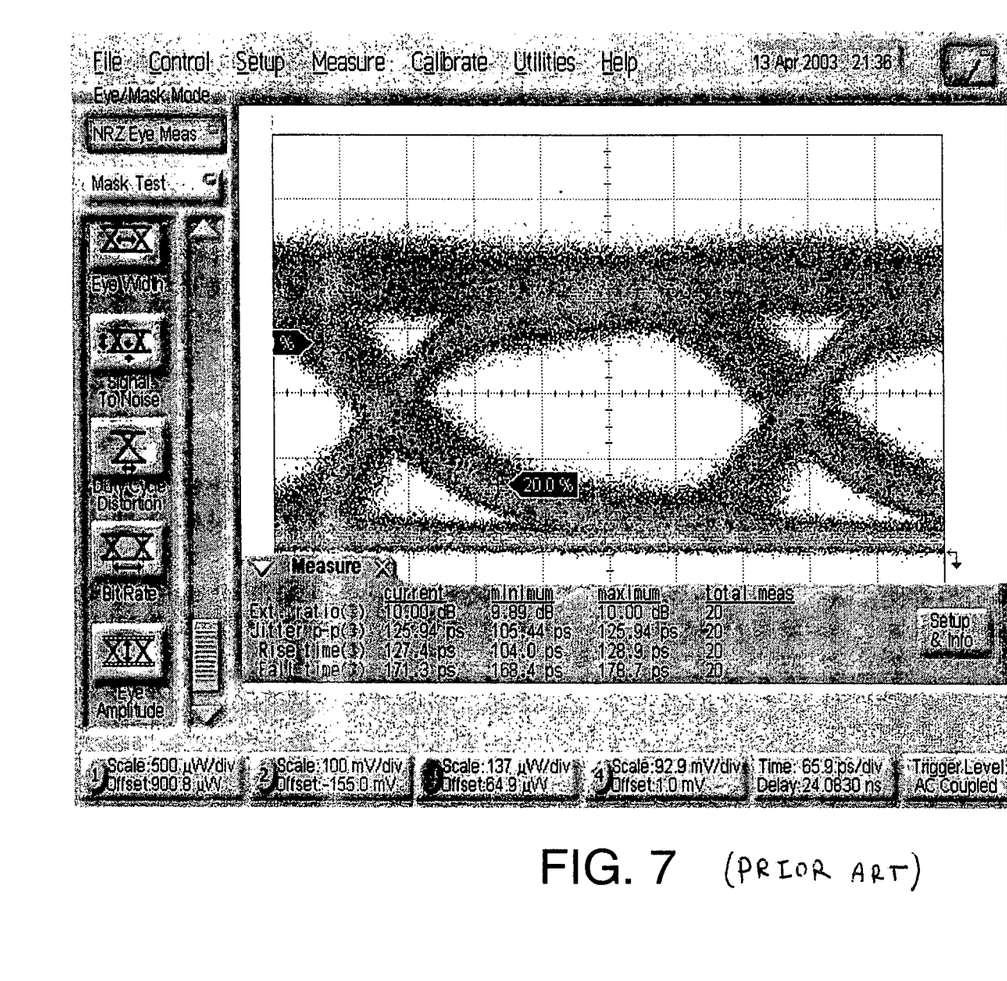
FIG. 7 is an eye diagram of conventional optical transmission module under data rate of 2.488Gbps.
Figure 8:
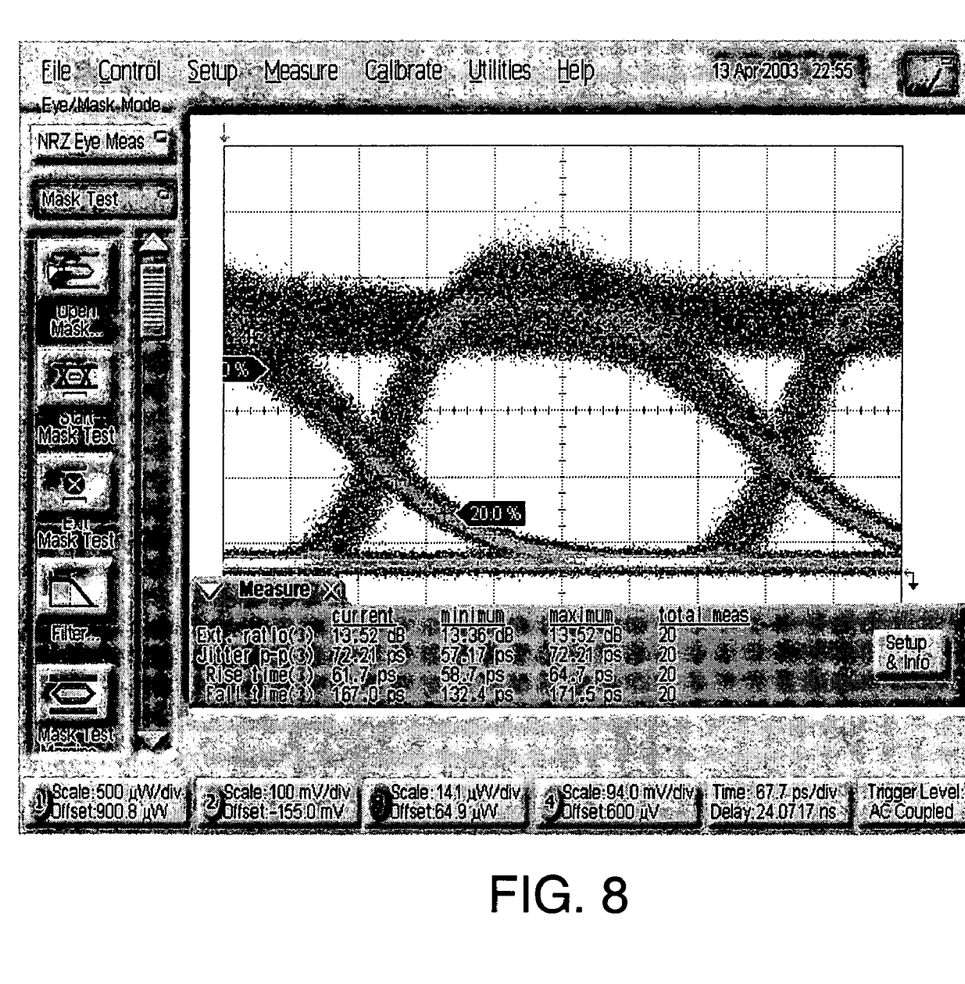
FIG. 8 is an eye diagram of an optical transmission module of the invention under data rate of 2.488Gbps.

The eye diagrams at the transmitter side are first compared. FIG. 7 is an eye diagram under 2.488Gbps data rate of a conventional module with photoelectric elements having 4 mm length pins. FIG. 8 is an eye diagram of the invention under same conditions. It is apparent that the invention has a great improvement.

Figure 9:
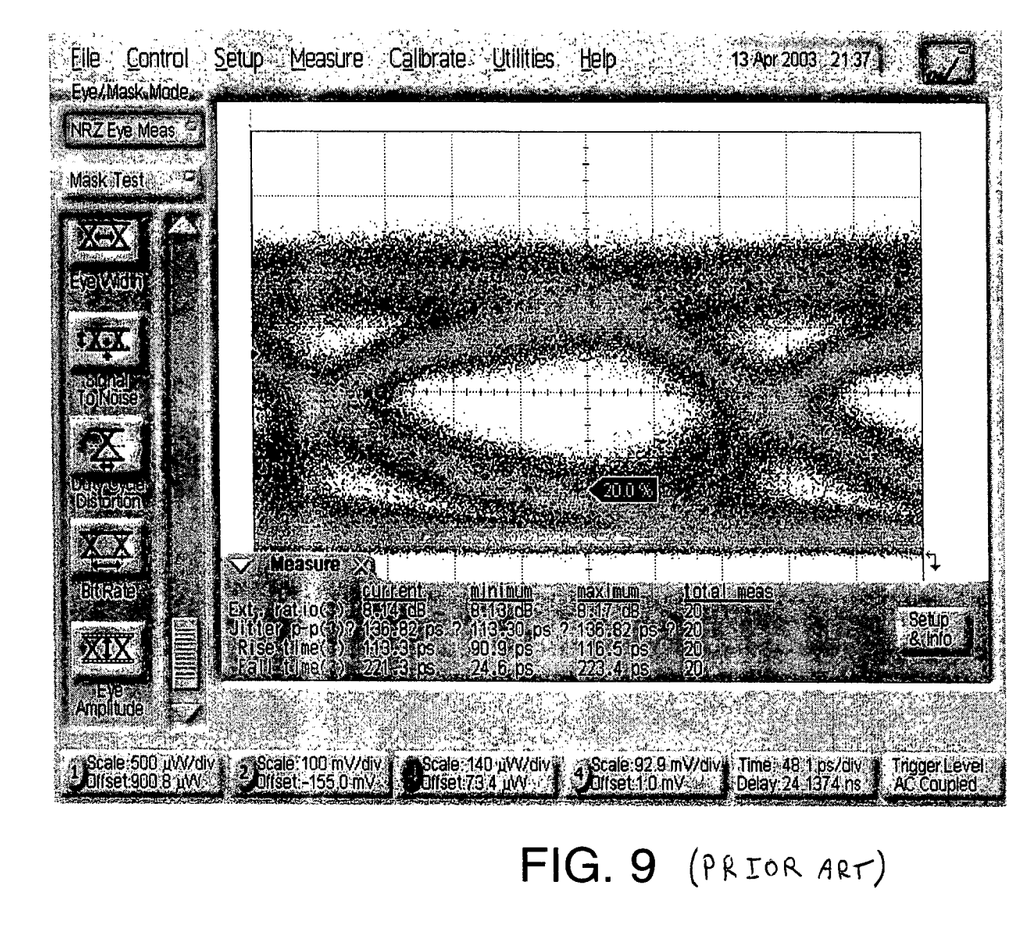
FIG. 9 is an eye diagram of conventional optical transmission module under data rate of 3.125Gbps.
Figure 10:
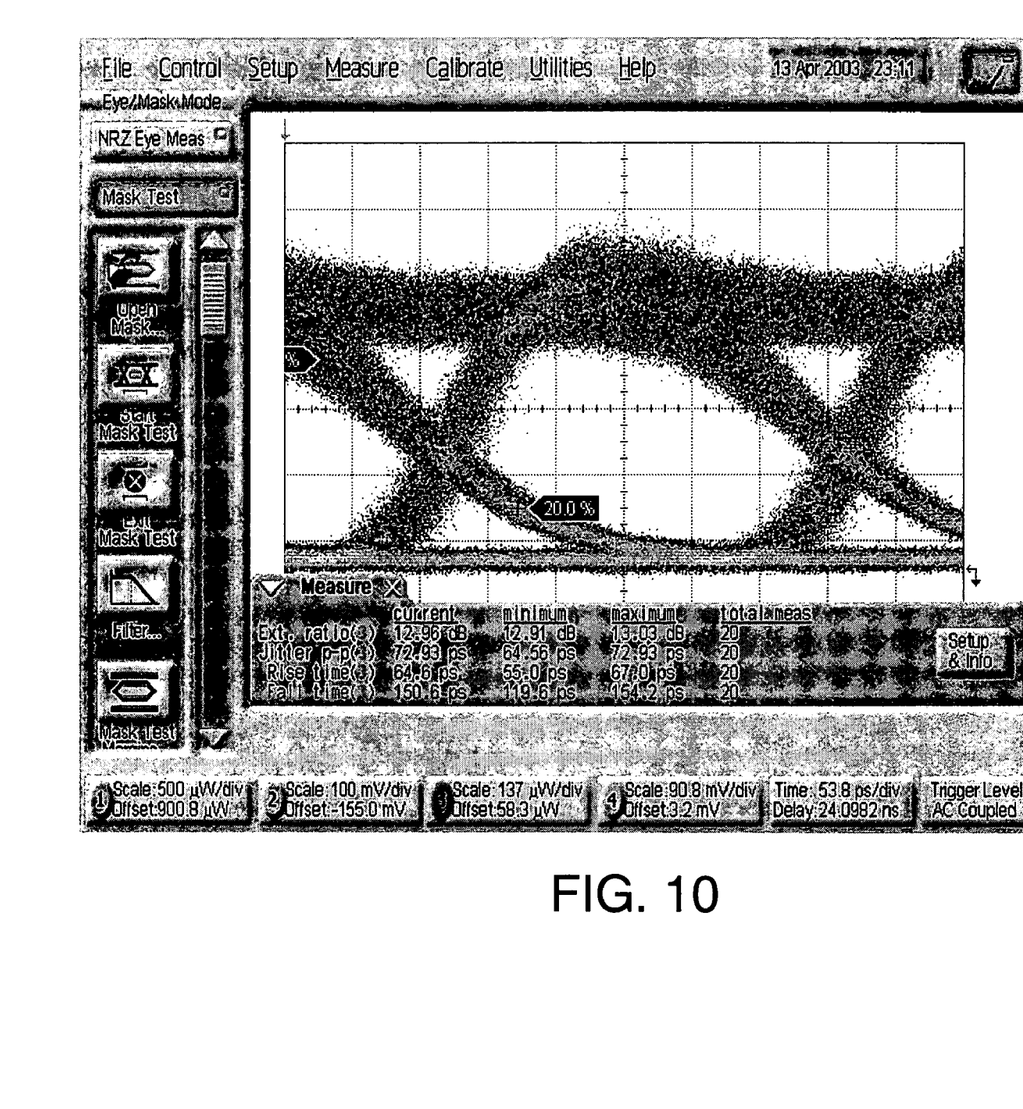
FIG. 10 is an eye diagram of an optical transmission module of the invention under data rate of 3.125Gbps.

FIG. 9 is an eye diagram under 3.125Gbps data rate of a conventional module with TOCAN photoelectric elements having 4 mm length pins. FIG. 10 is an eye diagram of the invention under same conditions. It is apparent that the invention has a great improvement when working under a higher data rate.

Nest, the eye diagrams of signal interference at the receiver side are compare using a standard light signal to check the receiver sensitivity. Three test conditions are used: first, no interfering signal to the receiver; second, using conventional TOCAN packaged photoelectric element for the transmitter; and third, using flexible printed circuit board for pin connection of the transmitter. When data rate is 2.488Gbps, the sensitivity of no interfering signal condition is −22.157dBm; the sensitivity of conventional package condition is −16.108dBm; and the sensitivity of flexible printed circuit board condition is −18.698dBm. The total is +3.5dBm. When data rate is 3.125Gbps, the sensitivity of no interfering signal condition is −20.468dBm; the sensitivity of conventional package condition is −14.314dBm; and the sensitivity of flexible printed circuit board condition is −17.085dBm. The total is +2.7dBm. The reference transmitter power is −4.588dBm. The interfered transmitter power is −5.448dBm.

Figure 11:
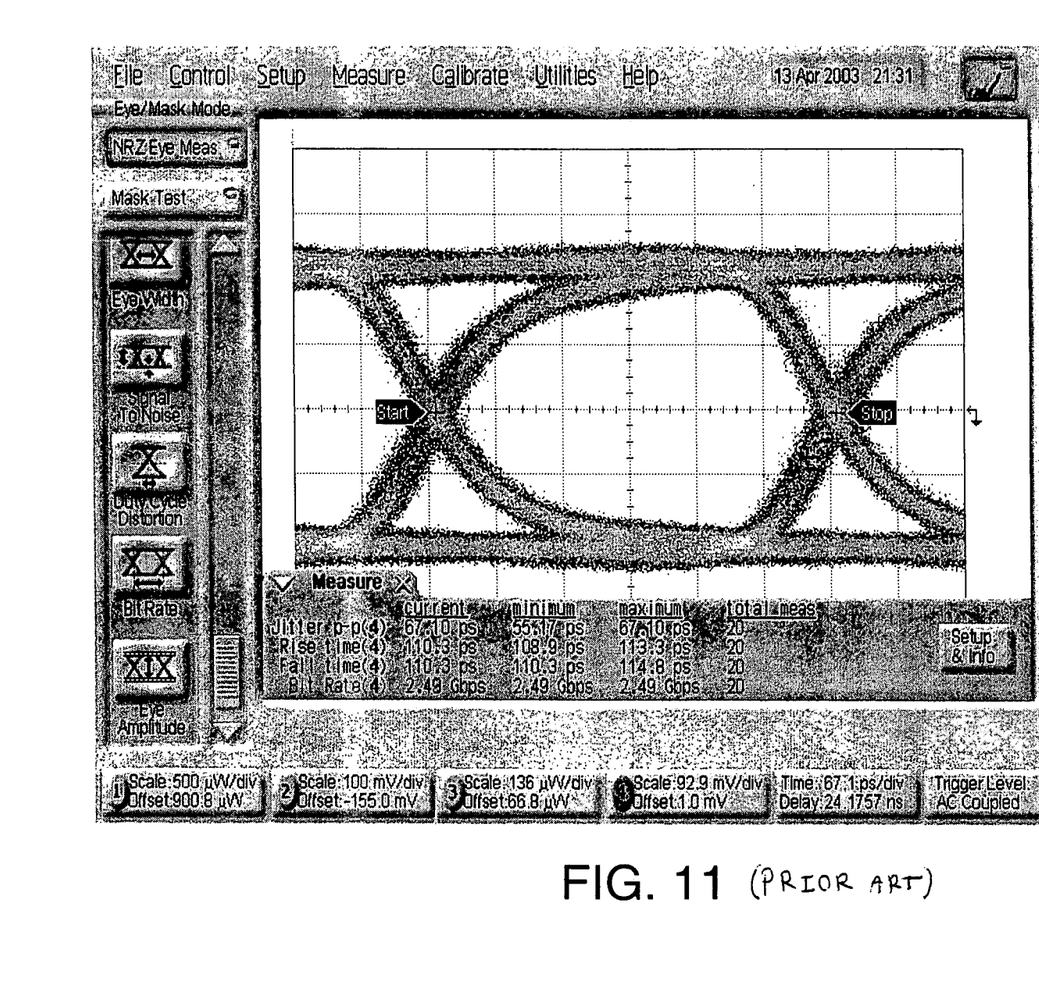
FIG. 11 is an eye diagram of conventional optical transmission module at the receiver side caused by interference.
Figure 12:
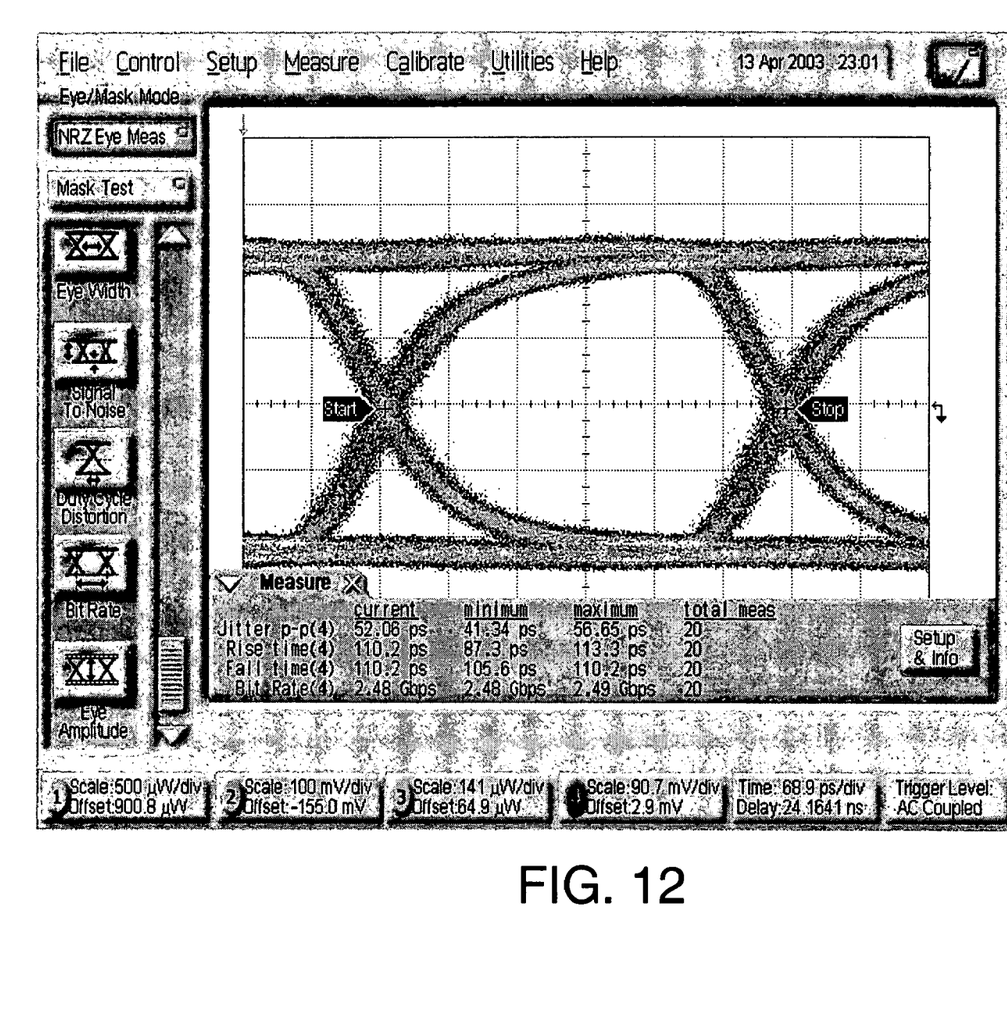
FIG. 12 is an eye diagram of an optical transmission module of the invention at the receiver side.

FIG. 11 and FIG. 12 are respective eyes diagrams under 2.488 Gbps data rate of conventional optical transmission module and the invention at the receiver side caused by interference. From FIG. 11, the conventional module, we can see that Jitter p-p=67 ps. From FIG. 12, the invention, we can see that Jitter p-p=52 ps.

The optical transmission module of the invention mainly solves the problems of bad signals and signal interference. From the aforesaid descriptions and illustrations we can see that the invention really solves the aforesaid problems when working with high data rate. Besides that, there are further advantages as follows:
1) Improving signal continuity and photoelectrical transformation;
2) Lower cost;
3) Easy assembly with direct soldering;
4) Improving reliability of assembly;
5) Reducing the connection stress between the photoelectric element and the printed circuit by using a flexible printed circuit board;
6) Capable of modification from an original design instead of a total redesign;
7) Easy fabrication of the simple circuit of flexible printed circuit board;
8) Better signal transmission lines to reduce signal distortion and impedance incontinuity so as to obtain signal continuity;
9) Good grounding to prevent from electromagnetic interference;
10) Good shielding to reduce signal crosstalk and improve the circuit stability;
11) Simple signal transmission lines on the flexible circuit board control the impedance in an easy way; and
12) No need of large bending on the flexible printed circuit board so as to improve reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical transmission module, comprising:
   at least one photoelectric element having a plurality of signal pins and at least one non-signal pin;
   a plurality of flexible printed circuit boards; and
   a printed circuit board, connecting to said flexible printed circuit board to form an electrical connection with said photoelectric element via said flexible printed circuit boards;
   wherein said flexible printed circuit boards and said photoelectric element are connected by flat contact such that the flexible printed circuit board can be extended from said pins and parallel to the optical axis of the photoelectric elements.

2. The optical transmission module according to claim 1 wherein said photoelectric element is a CAN packaged element.

3. The optical transmission module according to claim 2 wherein said photoelectric element is a Transistor Outline CAN element.

4. The optical transmission module according to claim 1 further comprises a passive element mounted on said signal transmission plane for impedance matching; one end of said passive element connects to pins of said photoelectric element; another end of said passive element connects to said printed circuit board via a signal transmission line.

5. The optical transmission module according to claim 1 wherein said flexible printed circuit boards optionally having a ground plane, and the rest optionally having at least one signal transmission plane for connecting to said signal pins, wherein said at least one non-signal pin connects to said ground plane to prevent electromagnetic interference.

6. An optical transmission module, comprising:
   at least one photoelectric transmitter having a plurality of signal pins and at least one non-signal pin;
   at least one photoelectric receiver having a plurality of signal pins and at least one non-signal pin;
   a plurality of flexible printed circuit boards; and
   a printed circuit board, connecting to said flexible printed circuit boards to form an electrical connection with said photoelectric transmitter/receiver via said flexible printed circuit boards;
   wherein said flexible printed circuit boards and said photoelectric transmitter and receiver are connected by flat contact such that the flexible printed circuit board can be extended from said pins and parallel to the optical axis of the photoelectric elements.

7. The optical transmission module according to claim 6 further comprises a passive element mounted on said signal transmission plane for impedance matching; one end of said passive element connects to pins of said photoelectric transmitter/receiver; another end of said passive element connects to said printed circuit board via a signal transmission line.

8. The optical transmission module according to claim 6 wherein said photoelectric transmitter/receiver is a CAN packaged element.

9. The optical transmission module according to claim 8 wherein said photoelectric transmitter/receiver is a Transistor Outline CAN element.

10. The optical transmission module according to claim 6 wherein said flexible printed circuit boards optionally having a ground plane, and the rest optionally having at least one signal transmission plane for connecting to said signal pins, wherein said at least one non-signal pin connects to said ground plane to prevent electromagnetic interference.

* * * * *